(12) United States Patent
Tsubota et al.

(10) Patent No.: US 12,727,438 B2
(45) Date of Patent: Sep. 1, 2026

(54) SUBSTRATE PROCESSING APPARATUS, SUSCEPTOR ASSEMBLY, METHOD OF MANUFACTURING SEMICONDUCTOR DEVICE AND SUBSTRATE PROCESSING METHOD

(71) Applicant: Kokusai Electric Corporation, Tokyo (JP)

(72) Inventors: Yasutoshi Tsubota, Toyama (JP); Takeshi Yasui, Toyama (JP); Tetsuaki Inada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 230 days.

(21) Appl. No.: 17/580,793

(22) Filed: Jan. 21, 2022

(65) Prior Publication Data

US 2022/0139760 A1 May 5, 2022

Related U.S. Application Data

(63) Continuation of application No. PCT/JP2019/036404, filed on Sep. 17, 2019.

(51) Int. Cl.
*H10P 72/76* (2026.01)
*H10P 72/00* (2026.01)

(52) U.S. Cl.
CPC ...... *H10P 72/7611* (2026.01); *H10P 72/0436* (2026.01); *H10P 72/7612* (2026.01); *H10P 72/7616* (2026.01)

(58) Field of Classification Search
CPC ................................................ H01L 21/67115
See application file for complete search history.

(56) References Cited

U.S. PATENT DOCUMENTS 5,304,248 A * 4/1994 Cheng ..................... C23C 16/04 118/728
5,446,824 A * 8/1995 Moslehi ............ H01L 21/67115 118/724

(Continued)

FOREIGN PATENT DOCUMENTS

CN 108834429 A 11/2018
JP H1050716 * 2/1998 ........... H01L 21/324

(Continued)

OTHER PUBLICATIONS

English translation JP 2006128205, 2006-05-18, Yokoyama (Year: 2006).*

(Continued)

*Primary Examiner* — Keath T Chen
(74) *Attorney, Agent, or Firm* — Volpe Koenig

(57) ABSTRACT

According to one aspect of the technique in the disclosure, there is provided a substrate processing apparatus including: a process chamber in which a substrate is accommodated; a susceptor configured to support the substrate in the process chamber; and a susceptor cover provided on an upper surface of the susceptor, wherein the susceptor includes: a heating element; and a first through-hole located so as to avoid the heating element, and the susceptor cover includes a second through-hole communicating with the first through-hole and having a diameter greater than a diameter of the first through-hole.

20 Claims, 8 Drawing Sheets

(56) References Cited

U.S. PATENT DOCUMENTS

| | | | | | |
|---|---|---|---|---|---|
| 5,616,024 | A * | 4/1997 | Nobori | C23C 16/46 432/5 |
| 5,653,808 | A * | 8/1997 | MacLeish | C23C 16/4584 118/725 |
| 5,688,331 | A * | 11/1997 | Aruga | C23C 16/46 118/728 |
| 2003/0044653 | A1 * | 3/2003 | Hiramatsu | C04B 35/58014 428/323 |
| 2004/0115947 | A1 * | 6/2004 | Fink | H01L 21/67103 438/716 |
| 2005/0000450 | A1 * | 1/2005 | Iizuka | H01L 21/68742 118/728 |
| 2009/0041568 | A1 * | 2/2009 | Muraoka | H01L 21/68742 414/586 |
| 2012/0252220 | A1 | 10/2012 | Harada et al. | |
| 2014/0106573 | A1 * | 4/2014 | Terasaki | H01L 21/32105 438/771 |
| 2018/0374740 | A1 * | 12/2018 | Sato | H01L 21/68757 |
| 2019/0006481 | A1 | 1/2019 | Nakayama et al. | |

FOREIGN PATENT DOCUMENTS

| | | | | |
|---|---|---|---|---|
| JP | 2002334820 | * | 11/2002 | H01L 21/02 |
| JP | 2002-373932 | A | 12/2002 | |
| JP | 2006128205 | * | 5/2006 | H01L 21/68 |
| JP | 2011-077147 | A | 4/2011 | |
| JP | 2012-216774 | A | 11/2012 | |
| JP | 2014-075579 | A | 4/2014 | |
| JP | WO 2017163409 | * | 9/2017 | H01L 21/67115 |
| JP | 6484388 | B2 | 3/2019 | |
| TW | 201608668 | A | 3/2016 | |
| WO | 2016/056338 | A1 | 4/2016 | |

OTHER PUBLICATIONS

English translation JP 2002373932, Dec. 2002, Hirayanagi (Year: 2002).*

Taiwan Office Action, Taiwan Patent Application No. 109127864, Apr. 15, 2021, w/English Translation, 18 pgs.

Japanese Office Action issued on Nov. 15, 2022 for Japanese Patent Application No. 2021-546085.

* cited by examiner

FIG. 3

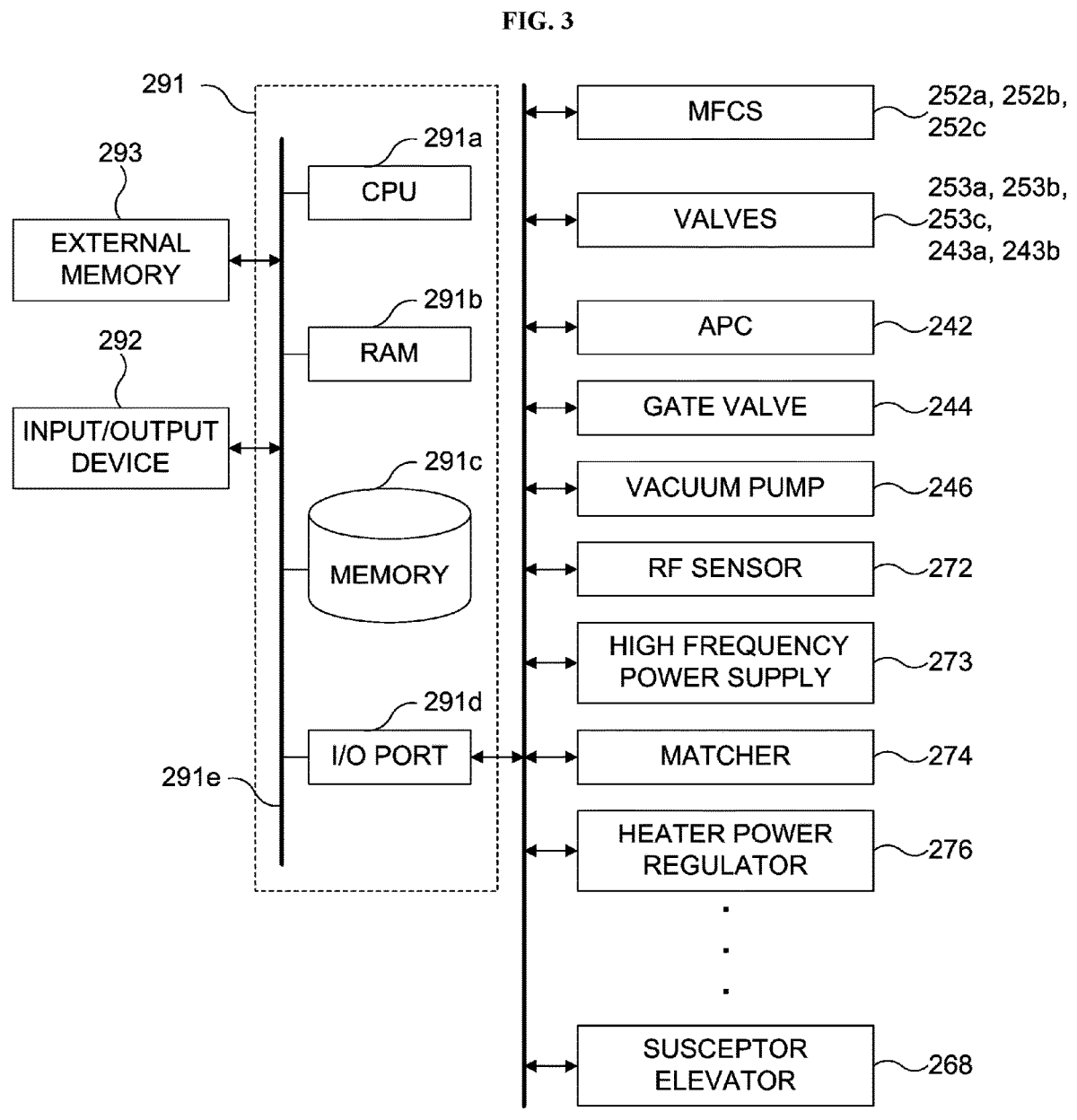

291
293
EXTERNAL MEMORY
292
INPUT/OUTPUT DEVICE
291a
CPU
291b
RAM
291c
MEMORY
291d
I/O PORT
291e
MFCS 252a, 252b, 252c
VALVES 253a, 253b, 253c, 243a, 243b
APC 242
GATE VALVE 244
VACUUM PUMP 246
RF SENSOR 272
HIGH FREQUENCY POWER SUPPLY 273
MATCHER 274
HEATER POWER REGULATOR 276
SUSCEPTOR ELEVATOR 268

FIG. 9

SUBSTRATE PROCESSING APPARATUS, SUSCEPTOR ASSEMBLY, METHOD OF MANUFACTURING SEMICONDUCTOR DEVICE AND SUBSTRATE PROCESSING METHOD

CROSS-REFERENCE TO RELATED PATENT APPLICATION

This application is a bypass continuation application of PCT International Application No. PCT/JP2019/036404, filed on Sep. 17, 2019, in the WIPO, the entire contents of which are hereby incorporated by reference.

1. FIELD

The present disclosure relates to a substrate processing apparatus, a susceptor assembly, a method of manufacturing a semiconductor device and a substrate processing method.

2. DESCRIPTION OF THE RELATED ART

When forming a circuit pattern of a semiconductor device such as a flash memory, a step of performing a predetermined process such as an oxidation process and a nitriding process on a substrate, which is a part of a manufacturing process of the semiconductor device, may be performed. For example, according to some related arts, a surface of a pattern (circuit pattern) formed on the substrate may be modified by performing a modification process by using a process gas excited by a plasma.

According to some related arts, a susceptor on which the substrate is placed is arranged in a process chamber of a substrate processing apparatus. A heater is provided on the susceptor to heat the substrate placed thereon. Further, the susceptor is provided with a through-hole and a lift pin inserted through the through-hole. After a substrate processing is completed, the substrate placed on the susceptor is elevated by the lift pin inserted through the through-hole. Thereby, the substrate becomes spaced apart from the susceptor.

In addition, according to another related arts, by covering an upper surface of the susceptor with a susceptor cover and placing the substrate on the susceptor cover, the heat generated by the susceptor heated by a heater is conducted to the susceptor cover to heat the substrate. In such a case, since the susceptor is provided with the through-hole and the lift pin, a hole communicating with the through-hole penetrates the susceptor cover.

Since the susceptor cover is opened at a location of its hole communicating with the through-hole of the susceptor, the heat from the susceptor cover may not be conducted to the substrate, and a portion of the substrate located above the hole may not be sufficiently heated. As a result, a local temperature drop of the substrate may occur on the surface of the substrate, in particular, on the portion of the substrate located above the hole.

SUMMARY

According to the present disclosure, there is provided a technique capable of obtaining a desired temperature distribution on a surface of a substrate placed on a susceptor cover by suppressing a local temperature drop at a portion of the substrate located above a hole of the susceptor cover communicating with a through-hole of a susceptor.

According to one or more embodiments of the present disclosure, there is provided a technique related to a substrate processing apparatus including: a process chamber in which a substrate is accommodated; a susceptor configured to support the substrate in the process chamber; and a susceptor cover provided on an upper surface of the susceptor, wherein the susceptor includes: a heating element; and a first through-hole located so as to avoid the heating element, and the susceptor cover includes a second through-hole communicating with the first through-hole and having a diameter greater than a diameter of the first through-hole.

BRIEF DESCRIPTION OF THE DRAWINGS

FIG. 3 is a block diagram schematically illustrating a configuration of a controller (control structure) and related components of the substrate processing apparatus according to the embodiments of the present disclosure.

FIG. 9 is a diagram schematically illustrating a part of the susceptor and the susceptor cover shown in FIG. 8 when viewed from above.

DETAILED DESCRIPTION

Embodiments

Figure 1:
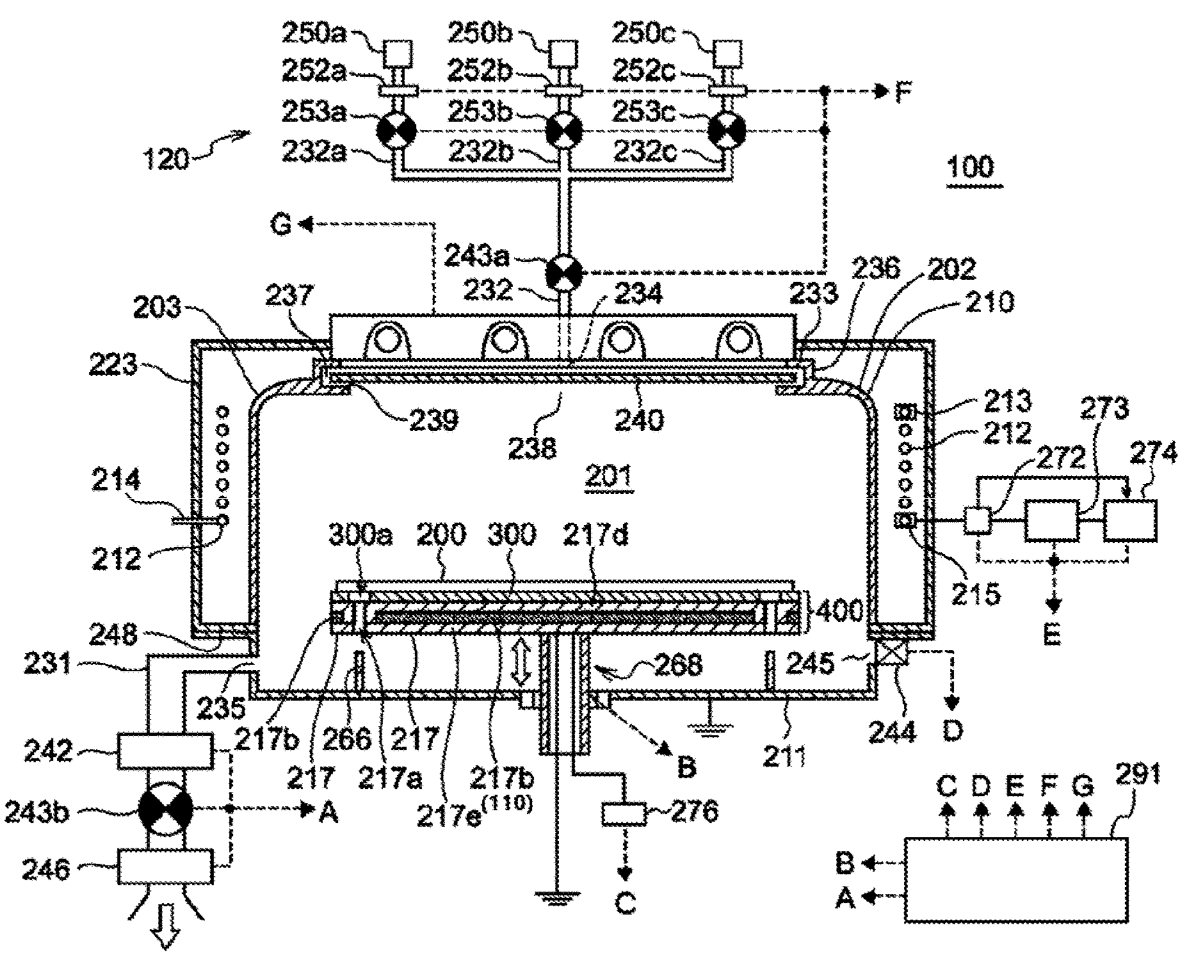
FIG. 1 is a diagram schematically illustrating a cross-section of a substrate processing apparatus according to one or more embodiments of the present disclosure.

Hereinafter, one or more embodiments (also simply referred to as "embodiments") according to the technique of the present disclosure will be described.

(1) Configuration of Substrate Processing Apparatus

A substrate processing apparatus according to the embodiments of the technique will be described below with reference to FIGS. 1 and 2. The substrate processing apparatus according to the present embodiments is configured to mainly perform an oxidation process on a film formed on a surface of a substrate.

<Process Chamber>

A substrate processing apparatus 100 includes a process furnace 202 in which a substrate 200 is processed by a plasma. The process furnace 202 includes a process vessel 203. A process chamber 201 is defined by the process vessel 203. The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined. The upper vessel 210 is made of a material capable of transmitting an electromagnetic wave, for example, a non-metallic material such as quartz ($SiO_2$).

For example, the lower vessel 211 is made of a material such as aluminum (Al). A gate valve 244 is provided on a lower side wall of the lower vessel 211.

The process chamber 201 includes a plasma generation space 201*a* (see FIG. 2) and a substrate processing space 201*b* (see FIG. 2) that communicates with the plasma generation space 201*a* and in which the substrate 200 is processed. An electromagnetic field generation electrode 212 constituted by a resonance coil is provided around the plasma generation space 201*a*. The plasma generation space 201*a* refers to a space in which the plasma is generated, for example, a space above a lower end of the electromagnetic field generation electrode 212 and below an upper end of the electromagnetic field generation electrode 212 in the process chamber 201. On the other hand, the substrate processing space 201*b* refers to a space in which the substrate 200 is processed by using the plasma, for example, a space below the lower end of the electromagnetic field generation electrode 212 in the process chamber 201.

<Susceptor>

A susceptor 217 serving as a substrate placing table on which the substrate 200 is placed is provided at a center of a bottom portion of the process chamber 201. For example, the susceptor 217 is of a circular shape when viewed from above, and is constituted by an upper surface portion 217*d*, a lower surface portion 217*e* and a susceptor heater 217*b* interposed therebetween. The upper surface portion 217*d* and the lower surface portion 217*e* are made of the same material. For example, each of the upper surface portion 217*d* and the lower surface portion 217*e* is made of a non-metallic material such as aluminum nitride (AlN), ceramics and quartz. According to the present embodiments, each of the upper surface portion 217*d* and the lower surface portion 217*e* may be made of transparent quartz, which is a material capable of being transmitted through by an infrared light component of an electromagnetic radiation described later radiated (or emitted) from the susceptor heater 217*b*.

The substrate 200 placed on the susceptor 217 is processed in the process chamber 201. The susceptor heater 217*b* serving as a part of a heater 110 configured to radiate an infrared light so as to heat the substrate 200 accommodated in the process chamber 201 is integrally embedded in the susceptor 217 between the upper surface portion 217*d* and the lower surface portion 217*e*. Specifically, the susceptor heater 217*b* is inserted into a groove provided on a lower surface of the upper surface portion 217*d*, and is covered with the lower surface portion 217*e* from a lower side of the susceptor heater 217*b*. When an electric power is supplied to the susceptor heater 217*b*, the susceptor heater 217*b* is configured to be capable of heating the substrate 200 such that the surface of the substrate 200 is heated to a predetermined temperature within a range from 25° C. to 800° C., for example. Further, for example, the susceptor heater 217*b* is made of a material selected from the group of silicon carbide (SiC), carbon and molybdenum. It is preferable that the susceptor heater 217*b* is made of SiC.

The susceptor heater 217*b* mainly radiates (or emits) a light whose wavelength is within an infrared light band (about 0.7 μm to 1000 μm). In particular, when the susceptor heater 217*b* is made of SiC, by supplying an electric current to the susceptor heater 217*b*, for example, the infrared light whose wavelength is about 1 μm to 20 μm, more preferably about 1 μm to 15 μm can be radiated from the susceptor heater 217*b*. In such a case, for example, a peak wavelength of the infrared light may be around 5 μm. In order to radiate a sufficient amount of the infrared light, it is preferable to elevate a temperature of the susceptor heater 217*b* to 500° C. or higher, preferably 1000° C. or higher. In the present specification, a notation of a numerical range such as "1 μm to 20 μm" means that a lower limit and an upper limit are included in the numerical range. Therefore, for example, a numerical range "1 μm to 20 μm" means a range equal to or higher than 1 μm and equal to or less than 20 μm. The same also applies to other numerical ranges described herein.

A susceptor elevator 268 including a driver (which is a driving structure) configured to elevate and lower the susceptor 217 is provided at the susceptor 217. In addition, a plurality of first through-holes including a first through-hole 217*a* and of a circular shape when viewed from above are provided at the susceptor 217, and a plurality of substrate lift pins including a substrate lift pin 266 are provided at a bottom of the lower vessel 211 at locations corresponding to the plurality of first through-holes. Hereinafter, the plurality of first through-holes including the first through-hole 217*a* may also be simply referred to as first through-holes 217*a*, and the plurality of substrate lift pins including the substrate lift pin 266 may also be simply referred to as substrate lift pins 266.

An upper surface of the susceptor 217 is covered with a susceptor cover 300. The susceptor cover 300 is of a circular shape slightly smaller than that of the susceptor 217 when viewed from above, and is made of a material different from that of the upper surface portion 217*d* and the lower surface portion 217*e*. For example, the susceptor cover 300 is made of a material such as SiC. The susceptor cover 300 is provided with a plurality of second through-holes including a second through-hole 300*a* communicating with the first through-hole 217*a* of the susceptor 217. Hereinafter, the plurality of second through-holes including the second through-hole 300*a* may also be simply referred to as second through-holes 300*a*. The second through-hole 300*a* is of a circular shape when viewed from above, and an inner diameter of the second through-hole 300*a* is greater than an inner diameter of the first through-hole 217*a*.

For example, at least three of the first through-holes 217*a*, at least three of the second through-holes 300*a* and at least three of the substrate lift pins 266 are provided at positions facing one another. When the susceptor 217 is lowered by the susceptor elevator 268, the substrate lift pins 266 pass through the first through-holes 217*a* and the second through-holes 300*a*, respectively.

A substrate support 400 according to the present embodiments is constituted mainly by the susceptor 217 and the susceptor cover 300.

<Process Gas Supplier>

A process gas supplier (which is a process gas supply structure or a process gas supply system) 120 configured to supply a process gas into the process vessel 203 is configured as follows.

A gas supply head 236 is provided above the process chamber 201, that is, on an upper portion of the upper vessel 210. The gas supply head 236 includes a cap-shaped lid 233, a gas inlet port 234, a buffer chamber 237, an opening 238, a shield plate 240 and a gas outlet port 239. The gas supply head 236 is configured to supply the process gas such as a reactive gas into the process chamber 201.

An oxygen-containing gas supply pipe 232*a* through which oxygen gas ($O_2$ gas) serving as an oxygen-containing gas is supplied, a hydrogen-containing gas supply pipe 232*b* through which hydrogen gas ($H_2$ gas) serving as a hydrogen-containing gas is supplied and an inert gas supply pipe 232*c* through which argon (Ar) gas serving as an inert gas is supplied are connected to join the gas inlet port 234. An oxygen gas supply source 250*a*, a mass flow controller (MFC) 252*a* serving as a flow rate controller and a valve 253*a* serving as an opening/closing valve are provided at the oxygen-containing gas supply pipe 232*a*. A hydrogen gas supply source 250*b*, an MFC 252*b* and a valve 253*b* are provided at the hydrogen-containing gas supply pipe 232*b*. An argon gas supply source 250*c*, an MFC 252*c* and a valve 253*c* are provided at the inert gas supply pipe 232*c*. A valve 243*a* is provided on a downstream side of a gas supply pipe 232 at a location where the oxygen-containing gas supply pipe 232*a*, the hydrogen-containing gas supply pipe 232*b* and the inert gas supply pipe 232*c* join. The valve 243*a* is connected to the gas inlet port 234.

The process gas supplier (which is the process gas supply system) 120 according to the present embodiments is constituted mainly by the gas supply head 236, the oxygen-containing gas supply pipe 232*a*, the hydrogen-containing gas supply pipe 232*b*, the inert gas supply pipe 232*c*, the MFCs 252*a*, 252*b* and 252*c*, the valves 253*a*, 253*b*, 253*c* and 243*a*.

<Exhauster>

A gas exhaust port 235 is provided on a side wall of the lower vessel 211. An inner atmosphere of the process chamber 201 is exhausted through the gas exhaust port 235. An upstream end of a gas exhaust pipe 231 is connected to the gas exhaust port 235. An APC (Automatic Pressure Controller) 242 serving as a pressure regulator (pressure adjusting structure), a valve 243*b* serving as an opening/closing valve and a vacuum pump 246 serving as a vacuum exhaust apparatus are provided at the gas exhaust pipe 231.

An exhauster (which is an exhaust structure of an exhaust system) is constituted mainly by the gas exhaust port 235, the gas exhaust pipe 231, the APC 242 and the valve 243*b*. The exhauster may further include the vacuum pump 246.

<Plasma Generator>

The electromagnetic field generation electrode 212 constituted by the resonance coil of a helical shape is provided around an outer periphery of the process chamber 201 so as to surround the process chamber 201, that is, around an outer portion of a side wall of the upper vessel 210. An RF (Radio Frequency) sensor 272, a high frequency power supply 273 and a matcher 274 configured to perform an impedance matching or an output frequency matching for the high frequency power supply 273 are connected to the electromagnetic field generation electrode 212. The electromagnetic field generation electrode 212 extends along an outer peripheral surface of the process vessel 203 so as to be spaced apart from the outer peripheral surface of the process vessel 203, and is configured to generate an electromagnetic field in the process vessel 203 when a high frequency power (RF power) is supplied to the electromagnetic field generation electrode 212. That is, the electromagnetic field generation electrode 212 according to the present embodiments may be constituted by an inductively coupled plasma (ICP) type electrode.

The high frequency power supply 273 is configured to supply the RF power to the electromagnetic field generation electrode 212. The RF sensor 272 is provided at an output side of the high frequency power supply 273. The RF sensor 272 is configured to monitor information of the traveling wave or reflected wave of the supplied high frequency power. The reflected wave of the RF power monitored by the RF sensor 272 is input to the matcher 274, and the matcher 274 is configured to adjust an impedance of the high frequency power supply 273 or a frequency of the RF power output from the high frequency power supply 273 so as to minimize the reflected wave based on the information of the reflected wave inputted from the RF sensor 272.

A winding diameter, a winding pitch and the number of winding turns of the resonance coil serving as the electromagnetic field generation electrode 212 are set such that the electromagnetic field generation electrode 212 resonates at a constant wavelength to form a standing wave of a predetermined wavelength. That is, an electrical length of the resonance coil is set to an integral multiple of a wavelength of a predetermined frequency of the high frequency power supplied from the high frequency power supply 273.

Both ends of the resonance coil serving as the electromagnetic field generation electrode 212 are electrically grounded. One end of the resonance coil is grounded via a movable tap 213, and the other end of the resonance coil is grounded via a fixed ground 214. In addition, in order to fine-tune the impedance of the resonance coil, a power feeder (not shown) is constituted by a movable tap 215 between the grounded ends of the resonance coil.

A shield plate 223 is provided as a shield against electric field outside the resonance coil serving as the electromagnetic field generation electrode 212.

The plasma generator according to the present embodiments is constituted mainly by the electromagnetic field generation electrode 212, the RF sensor 272 and the matcher 274. The plasma generator may further include the high frequency power supply 273.

Hereinafter, a principle of generating the plasma in the substrate processing apparatus 100 according to the present embodiments and properties of the generated plasma will be described with reference to FIG. 2.

When the plasma is generated by a plasma generation circuit constituted by the electromagnetic field generation electrode 212, an actual resonance frequency may fluctuate slightly depending on conditions such as a variation (change) in a capacitive coupling between a voltage portion of the resonance coil and the plasma, a variation in an inductive coupling between the plasma generation space 201*a* and the plasma and an excitation state of the plasma.

Therefore, according to the present embodiments, the matcher 274 is configured to increase or decrease the impedance or the output frequency of the high frequency power supply 273 such that the power of the reflected wave is minimized based on the power of the reflected wave from the electromagnetic field generation electrode 212 detected by the RF sensor 272 when the plasma is generated.

Figure 2:
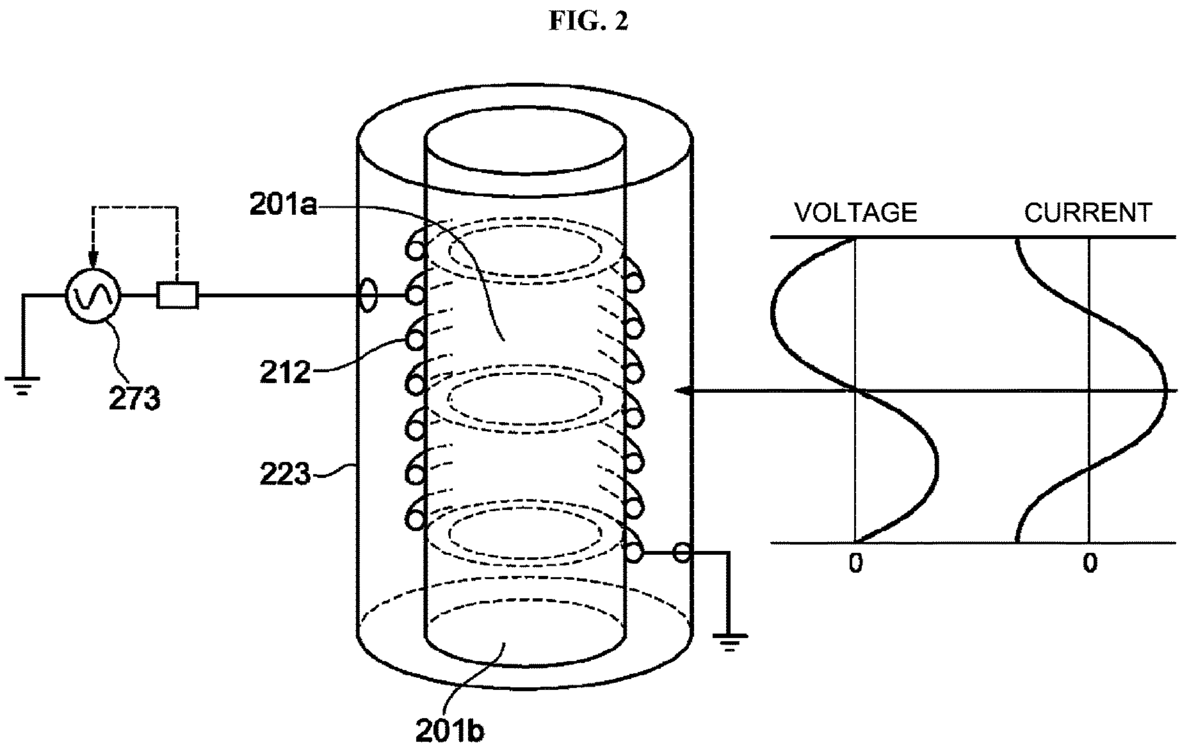
FIG. 2 is a diagram schematically illustrating a principle of generating a plasma in the substrate processing apparatus according to the embodiments of the present disclosure.

With such a configuration, as shown in FIG. 2, the high frequency power in accordance with the actual resonance frequency of the resonance coil combined with the plasma is supplied to the electromagnetic field generation electrode 212 according to the present embodiments. Therefore, the standing wave in which the phase voltage thereof and the opposite phase voltage thereof are always canceled out by each other is generated in the electromagnetic field generation electrode 212. When the electrical length of the resonance coil serving as the electromagnetic field generation electrode 212 and the wavelength of the high frequency power are the same, the highest phase current is generated at an electric midpoint of the resonance coil (node with zero voltage). Therefore, a donut-shaped induction plasma whose electric potential is extremely low is generated in the vicinity of the electric midpoint of the resonance coil. The donut-shaped induction plasma is hardly capacitively coupled with walls of the process chamber 201 or the susceptor 217.

<Controller>

A controller 291 serving as a control structure is configured to individually control the APC 242, the valve 243*b* and the vacuum pump 246 through a signal line "A", the susceptor elevator 268 through a signal line "B", a heater power regulator 276 through a signal line "C", the gate valve 244 through a signal line "D", the RF sensor 272, the high frequency power supply 273 and the matcher 274 through a signal line "E", and the MFCs 252*a*, 252*b* and 252*c* and the valves 253*a*, 253*b*, 253*c* and 243*a* through a signal line "F".

As shown in FIG. 3, the controller 291 serving as a control structure (control apparatus) is constituted by a computer including a CPU (Central Processing Unit) 291*a*, a RAM (Random Access Memory) 291*b*, a memory 291*c* and an I/O port 291*d*. The RAM 291*b*, the memory 291*c* and the I/O port 291*d* may exchange data with the CPU 291*a* through an internal bus 291*e*. For example, an input/output device 292 constituted by components such as a touch panel and a display may be connected to the controller 291.

The memory 291*c* may be embodied by a component such as a flash memory and a hard disk drive (HDD). For example, a control program configured to control the operation of the substrate processing apparatus 100 and a process recipe in which information such as sequences and conditions of a substrate processing described later is stored may be readably stored in the memory 291*c*. The process recipe is obtained by combining steps of the substrate processing described later such that the controller 291 can execute the steps to acquire a predetermined result, and functions as a program. Hereinafter, the process recipe and the control program are collectively or individually referred to as a "program". In the present specification, the term "program" may refer to the process recipe alone, may refer to the control program alone, or may refer to both of the process recipe and the control program.

The I/O port 291*d* is electrically connected to the above-described components such as the MFCs 252*a*, 252*b* and 252*c*, the valves 253*a*, 253*b*, 253*c*, 243*a* and 243*b*, the gate valve 244, the APC 242, the vacuum pump 246, the RF sensor 272, the high frequency power supply 273, the matcher 274, the susceptor elevator 268 and the heater power regulator 276.

The CPU 291*a* is configured to read and execute the control program stored in the memory 291*c*, and to read the process recipe stored in the memory 291*c* in accordance with an instruction such as an operation command inputted via the input/output device 292. The CPU 291*a* is configured to control the operation of the substrate processing apparatus 100 according to the read process recipe. For example, the CPU 291*a* may be configured to perform the operation, according to the read process recipe, such as an operation of adjusting an opening degree of the APC 242, an opening and closing operation of the valve 243*b* and a start and stop of the vacuum pump 246 via the I/O port 291*d* and the signal line "A", an elevating and lowering operation of the susceptor elevator 268 via the I/O port 291*d* and the signal line "B", a power supply amount adjusting operation (temperature adjusting operation) to the susceptor heater 217*b* by the heater power regulator 276 via the I/O port 291*d* and the signal line "C", an opening and closing operation of the gate valve 244 via the I/O port 291*d* and the signal line "D", a controlling operation of the RF sensor 272, the matcher 274 and the high frequency power supply 273 via the I/O port 291*d* and the signal line "E", and flow rate adjusting operations for various gases by the MFCs 252*a*, 252*b* and 252*c* and opening and closing operations of the valves 253*a*, 253*b*, 253*c* and 243*a* via the I/O port 291*d* and the signal line "F".

The controller 291 may be embodied by installing the above-described program stored in an external memory 293 into a computer. The memory 291*c* or the external memory 293 may be embodied by a non-transitory computer readable recording medium. In the present specification, the term "recording medium" may refer to the memory 291*c* alone, may refer to the external memory 293 alone, and may refer to both of the memory 291*c* and the external memory 293.

(2) Substrate Processing

Figure 4:
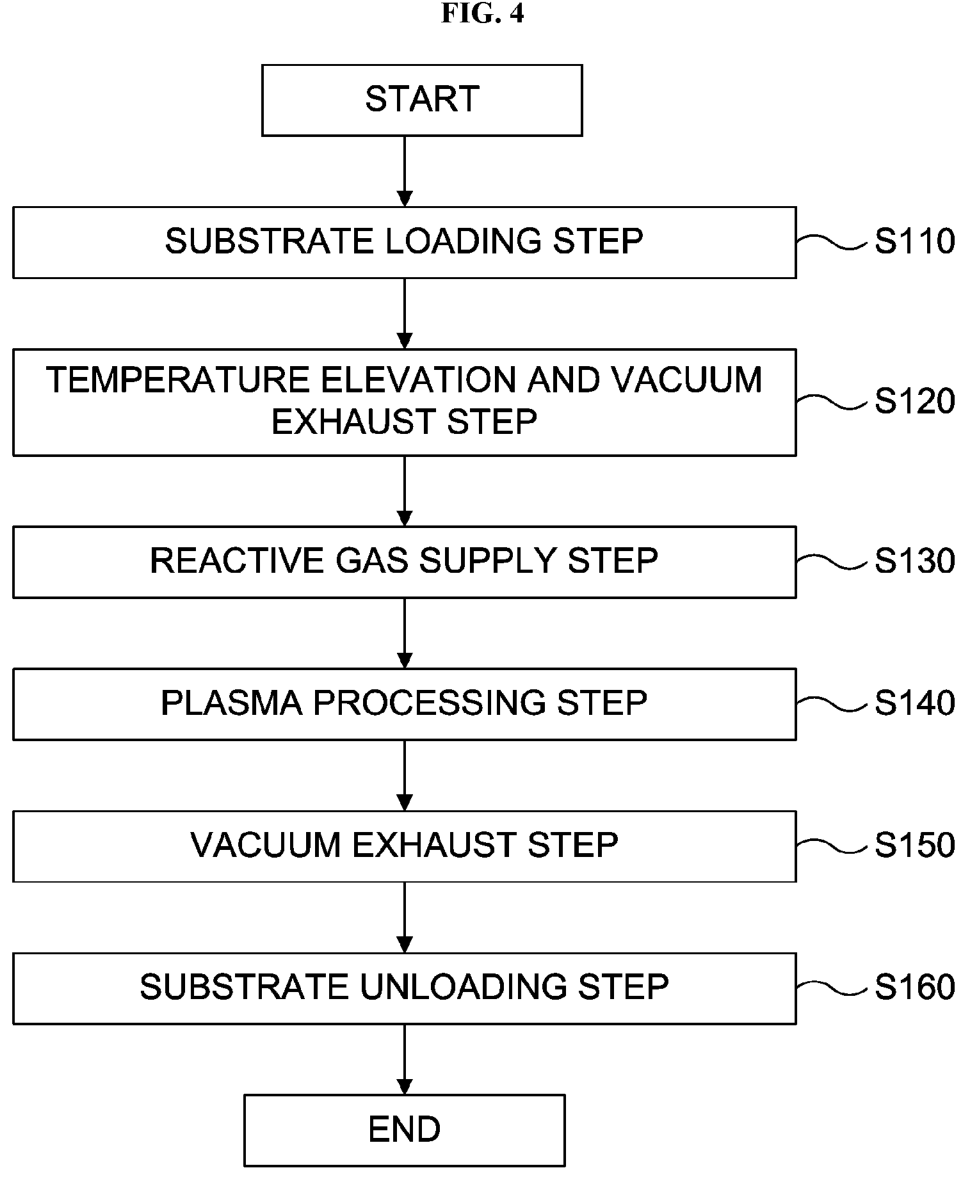
FIG. 4 is a flowchart schematically illustrating a substrate processing according to the embodiments of the present disclosure.

Subsequently, the substrate processing according to the present embodiments will be described mainly with reference to FIG. 4. FIG. 4 is a flow chart schematically illustrating the substrate processing according to the present embodiments. The substrate processing according to the present embodiments, which is a part of a manufacturing process of a semiconductor device (a method of manufacturing a semiconductor device) such as a flash memory, is performed by using the substrate processing apparatus 100 described above. In the following description, the operations of the components constituting the substrate processing apparatus 100 are controlled by the controller 291.

In addition, a silicon layer is formed in advance on the surface of the substrate 200 to be processed in the substrate processing according to the present embodiments. In the present embodiments, for example, the oxidation process serving as a process using the plasma is performed on the silicon layer.

<Substrate Loading Step S110>

First, the susceptor 217 is lowered to a position of transferring the substrate 200 by the susceptor elevator 268 such that the substrate lift pins 266 pass through the first through-holes 217*a* of the susceptor 217 and the second through-holes 300*a* of the susceptor cover 300. Subsequently, the gate valve 244 is opened, and the substrate 200 is transferred (loaded) into the process chamber 201 by using a substrate transfer device (not shown) from a vacuum transfer chamber (not shown) provided adjacent to the process chamber 201. The substrate 200 loaded into the process chamber 201 is supported in a horizontal orientation by the substrate lift pins 266 protruding from a surface of the susceptor cover 300. Thereafter, the susceptor elevator 268 elevates the susceptor 217 until the substrate 200 is placed on an upper surface of the susceptor cover 300 and supported by the susceptor cover 300.

<Temperature Elevation and Vacuum Exhaust Step S120>

Subsequently, a temperature of the substrate 200 loaded into the process chamber 201 is elevated. In the step S120, the susceptor heater 217*b* is heated in advance, for example, to a predetermined temperature within a range of 500° C. to 1,000° C., and the substrate 200 placed on the susceptor 217 (that is, on the susceptor cover 300) is heated to the predetermined temperature by the heat generated by the susceptor heater 217*b*. In the step S120, for example, the substrate 200 is heated such that the temperature of the substrate 200 reaches and is maintained at 700° C. Further, while the substrate 200 is being heated, the vacuum pump 246 vacuum-exhausts the inner atmosphere of the process chamber 201 through the gas exhaust pipe 231 such that an inner pressure of the process chamber 201 reaches and is maintained at a predetermined pressure. The vacuum pump 246 vacuum-exhausts the inner atmosphere of the process chamber 201 at least until a substrate unloading step S160 described later is completed.

<Reactive Gas Supply Step S130>

Subsequently, the $O_2$ gas (which is the oxygen-containing gas) and the $H_2$ gas (which is the hydrogen-containing gas) are supplied into the process chamber 201 as the reactive gas. Specifically, the valves 253*a* and 253*b* are opened to supply the $O_2$ gas and the $H_2$ gas, respectively, into the process chamber 201 while flow rates of the $O_2$ gas and the $H_2$ gas are adjusted by the MFCs 252*a* and 252*b*, respectively.

In the reactive gas supply step S130, the inner atmosphere of the process chamber 201 is exhausted by adjusting the opening degree of the APC 242 such that the inner pressure of the process chamber 201 reaches and is maintained at a predetermined pressure. The $O_2$ gas and the $H_2$ gas are continuously supplied into the process chamber 201 while the inner atmosphere of the process chamber 201 is appropriately exhausted until a plasma processing step S140 described later is completed.

<Plasma Processing Step S140>

When the inner pressure of the process chamber 201 is stabilized, the high frequency power is supplied to the electromagnetic field generation electrode 212 from the high frequency power supply 273. Thereby, a high frequency electric field is formed in the plasma generation space 201*a* to which the $O_2$ gas and the $H_2$ gas are supplied, and the donut-shaped induction plasma whose plasma density is the highest is excited by the high frequency electric field at a height corresponding to the electric midpoint of the electromagnetic field generation electrode 212 in the plasma generation space 201*a*. The process gas such as the $O_2$ gas and the $H_2$ gas are plasma excited and dissociate. As a result, reactive species such as oxygen radicals containing oxygen (oxygen active species), oxygen ions, hydrogen radicals containing hydrogen (hydrogen active species) and hydrogen ions may be generated.

The radicals generated by the induction plasma and non-accelerated ions are uniformly supplied onto the surface of the substrate 200 placed on the susceptor 217 in the substrate processing space 201*b*. Then, the radicals and the ions uniformly supplied onto the surface of the substrate 200 uniformly react with the silicon layer formed on the surface of the substrate 200. Thereby, the silicon layer is modified into a silicon oxide layer whose step coverage is good.

After a predetermined process time has elapsed (for example, 10 seconds to 1,000 seconds), the supply of the high frequency power from the high frequency power supply 273 is stopped to stop a plasma discharge in the process chamber 201. In addition, the valves 253*a* and 253*b* are closed to stop the supply of the $O_2$ gas and the supply of the $H_2$ gas into the process chamber 201. Thereby, the plasma processing step S140 is completed.

<Vacuum Exhaust Step S150>

After the supply of the $O_2$ gas and the supply of the $H_2$ gas are stopped, the inner atmosphere of the process chamber 201 is vacuum-exhausted through the gas exhaust pipe 231. Thereby, the gas such as the $O_2$ gas and the $H_2$ gas in the process chamber 201 is exhausted outside of the process chamber 201. Thereafter, the opening degree of the APC 242 is adjusted such that the inner pressure of the process chamber 201 is adjusted to the same pressure as that of the vacuum transfer chamber (not shown) provided adjacent to the process chamber 201.

<Substrate Unloading Step S160>

After the inner pressure of the process chamber 201 is adjusted to a predetermined pressure, the susceptor 217 is lowered to the position of transferring the substrate 200 until the substrate 200 is supported by the substrate lift pins 266. Then, the gate valve 244 is opened, and the substrate 200 is transferred (unloaded) out of the process chamber 201 by using the substrate transfer device (not shown). Thereby, the substrate processing according to the present embodiments is completed.

<Susceptor Cover>

As described above, the substrate processing apparatus 100 according to the embodiments of the present disclosure includes: the process chamber 201 in which the substrate 200 is accommodated; the substrate support 400 provided in the process chamber 201 and including the susceptor 217 configured to support the substrate 200 and the susceptor cover 300 provided on the upper surface of the susceptor 217. The susceptor 217 serves as a heating element capable of heating the substrate 200, and is provided with the susceptor heater 217*b* configured by a heater wire and the first through-holes 217*a* which are through-holes provided at a plurality of positions avoiding a physical contact with the susceptor heater 217*b*. The susceptor cover 300 is provided with the second through-holes 300*a* communicating with the first through-holes 217*a*. As described above, a diameter (inner diameter) of each of the second through-holes 300*a* is greater than a diameter (inner diameter) of each of the first through-holes 217*a*.

In other words, in the substrate processing apparatus 100 provided with the process chamber 201 in which the substrate 200 is accommodated, the susceptor cover 300 is provided on the upper surface of the susceptor 217 (which is configured to support the substrate 200) included in the substrate support 400 provided in the process chamber 201. Further, the susceptor cover 300 is provided with: the susceptor heater 217*b* serving as the heating element and configured to heat the substrate 200; and the second through-holes 300*a* communicating with the first through-holes 217*a* of the susceptor 217 (which are the through-holes provided at the plurality of positions avoiding a physical contact with the susceptor heater 217*b*). As described above, the diameter (inner diameter) of each of the second through-holes 300*a* is greater than the diameter (inner diameter) of each of the first through-holes 217*a*.

Figure 5:
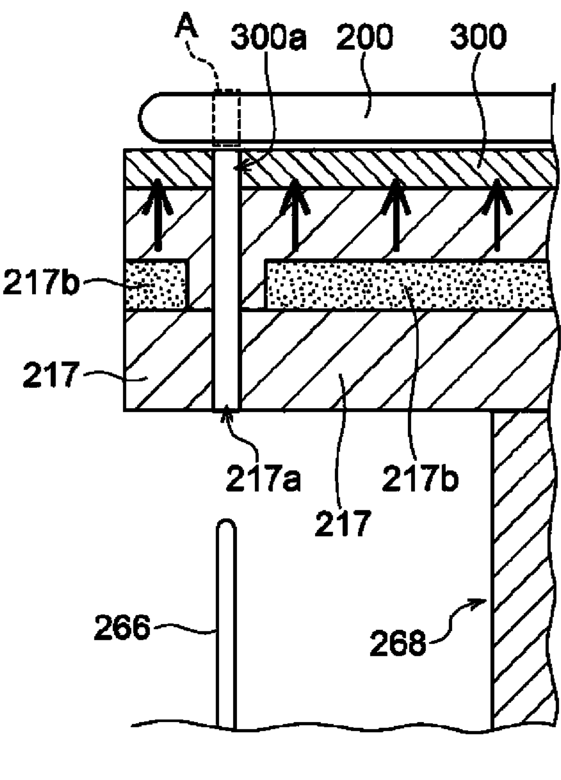
FIG. 5 is a diagram schematically illustrating a part of the substrate processing apparatus when a diameter of a first through-hole and a diameter of a second through-hole are the same.

When the diameters of the first through-hole 217*a* and the second through-hole 300*a* are the same as shown in FIG. 5, the electromagnetic radiation generated from the susceptor heater 217*b* (hereinafter, also referred to as "direct radiation", for example, indicated by a solid line arrow in FIG. 5) is not transmitted as a heat radiation to a portion of the substrate 200 immediately above the second through-hole 300*a* (a portion "A" enclosed by a broken line in FIG. 5). Further, the electromagnetic radiation generated from the susceptor 217 heated by the susceptor heater 217*b* (hereinafter, also referred to as "indirect radiation") is not transmitted as a heat radiation to the portion of the substrate 200 (that is, the portion A). As a result, the portion A may be insufficiently heated as compared with other portions of the substrate 200, and a local temperature drop may occur on the surface of the substrate 200. Therefore, when the substrate processing such as a film-forming process is performed, a uniformity of the substrate processing on the surface of the substrate 200 may decrease. For example, a thickness of the film may be locally reduced on an upper surface of the portion A.

On the other hand, since the diameter of the second through-hole 300*a* is greater than the diameter of the first through-hole 217*a* as shown in FIG. 1, a portion of a surface of the susceptor 217 is exposed through the second through-hole 300*a* when viewed from above. The electromagnetic radiation from the susceptor 217 reaches the portion (that is, the portion A) of the substrate 200 immediately above the second through-hole 300*a* through the exposed portion described above. Thereby, the portion (that is, the portion A) is also sufficiently heated by the electromagnetic radiation. That is, by providing the first through-holes 217*a* and the second through-holes 300*a* in the susceptor 217 and the susceptor cover 300, respectively, for the purpose of accommodating the substrate lift pins 266, it is possible to suppress a local temperature drop on the surface of the substrate 200 while being heated. That is, it is possible to prevent (or suppress) the temperature of the substrate 200 from being locally lowered around the second through-holes 300*a* while the substrate 200 is being heated. It is also possible to adjust a temperature distribution on the surface of the substrate 200. In particular, it is possible to improve a temperature uniformity on the surface of the substrate 200.

More specifically, by setting the diameters of the first through-holes 217*a* and the second through-holes 300*a* such that at least one among the direct radiation from the heated susceptor heater 217*b* and the indirect radiation from the susceptor 217 can be directly incident onto the substrate 200, it is possible to prevent (or suppress) the temperature of the substrate 200 from being locally lowered around the second through-holes 300*a*.

Further, by changing a shape of the susceptor cover 300 (particularly, the diameters of the second through-holes 300*a*), it is possible to adjust a uniformity of the temperature distribution on the surface of the substrate 200 without changing an arrangement pattern of the susceptor heater 217*b* in the susceptor 217. In other words, even when the same susceptor 217 is used, it is possible to adjust the uniformity of the temperature distribution on the surface of the substrate 200 by changing the shape of the susceptor cover 300.

For example, according to the present embodiments, the susceptor 217, the first through-hole 217*a* and the second through-holes 300*a* are arranged such that the indirect radiation (which is the electromagnetic radiation from the heated susceptor 217 rather than the heated susceptor heater 217*b*) is incident onto the substrate 200 through the second through-holes 300*a*.

Figure 6:
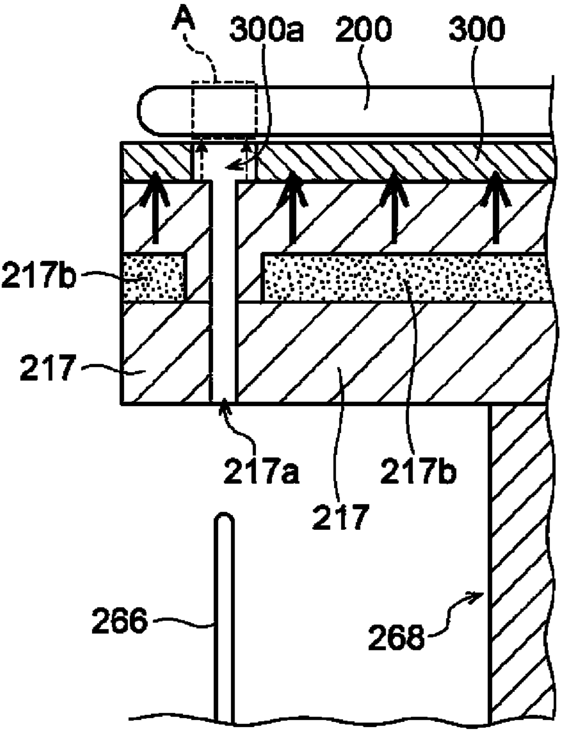
FIG. 6 is a diagram schematically illustrating a part of the substrate processing apparatus when the diameter of the second through-hole is greater than the diameter of the first through-hole and a susceptor heater is not provided immediately below the second through-hole.
Figure 7:
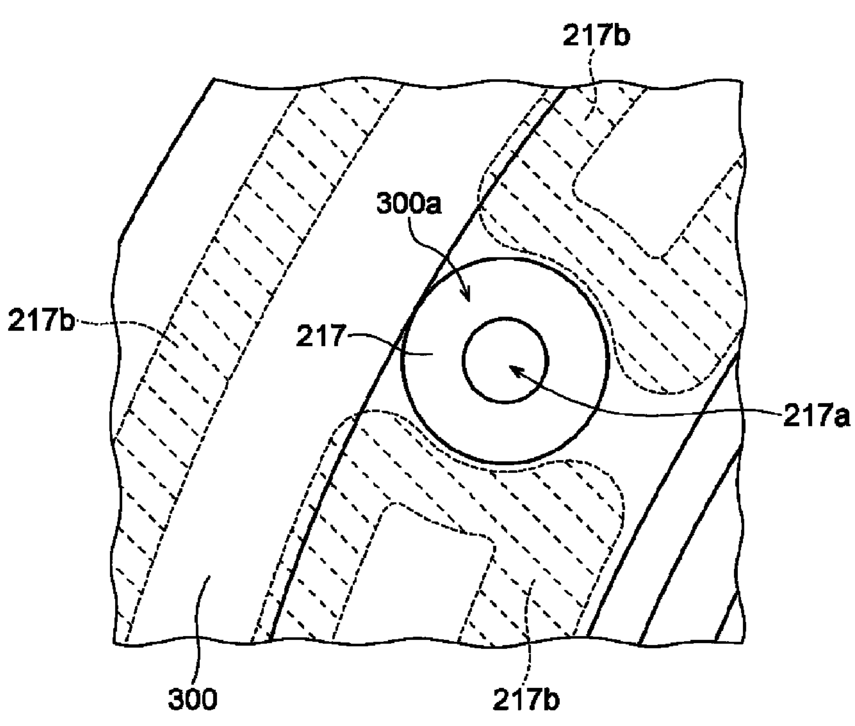
FIG. 7 is a diagram schematically illustrating a part of a susceptor and a susceptor cover shown in FIG. 6 when viewed from above.

That is, as shown in FIGS. 6 and 7, in a case where the diameter of the second through-hole 300*a* is greater than the diameter of the first through-hole 217*a*, the indirect radiation from the susceptor 217 heated by the susceptor heater 217*b* (indicated by a broken line arrow in FIG. 6) reaches the portion A of the substrate 200 immediately above the second through-hole 300*a* even when the susceptor heater 217*b* is not provided immediately below the second through-hole 300*a*. As a result, the portion A is also heated sufficiently. Further, when the direct radiation from the susceptor heater 217*b* is obliquely incident on the surface (interface) of the susceptor 217 exposed through the second through-hole 300*a*, a part of the direct radiation may not be reflected but reach the portion A through the second through-hole 300*a* to contribute to heating the portion A. The smaller a distance between the second through-hole 300*a* and the susceptor heater 217*b* when viewed from above, the larger an amount of such direct radiation; and the larger the distance, the smaller the amount of such direct radiation. In particular, when the distance is large and an angle of incidence on the surface (interface) of the susceptor 217 exposed through the second through-hole 300*a* exceeds a critical angle, such direct radiation substantially fails to reach the portion A and contribute to heating the portion A.

For example, as shown in FIG. 7, the susceptor heater 217*b* is provided in a pattern designed to avoid an overlap with the first through-holes 217*a* in order to secure a space for providing the first through-holes 217*a* through which the substrate lift pins 266 are elevated or lowered. Further, in an example shown in FIG. 7, the susceptor heater 217*b* is arranged so as to be folded back near the second through-hole 300*a* so as to avoid an overlap with a region vertically below the second through-hole 300*a*. With such a configuration, since the direct radiation from the susceptor heater 217*b* is incident not directly but indirectly onto the substrate 200, it is possible to suppress a local excessive heating.

Further, according to the present embodiments, the susceptor heater 217*b* and the second through-holes 300*a* may be arranged such that the direct radiation (which is the electromagnetic radiation from the heated susceptor heater 217*b*) is incident onto the substrate 200 through the second through-holes 300*a*.

Figure 8:
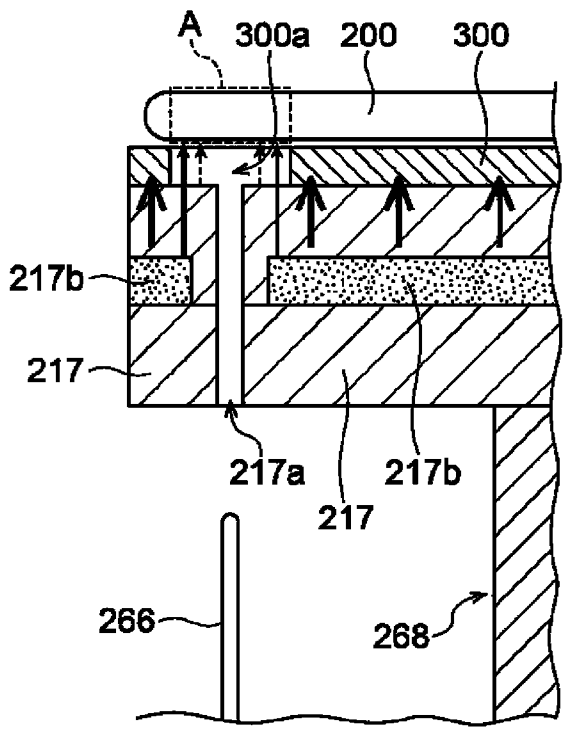
FIG. 8 is a diagram schematically illustrating a part of the substrate processing apparatus when the diameter of the second through-hole is greater than the diameter of the first through-hole and the susceptor heater is provided immediately below the second through-hole.
Figure 9:
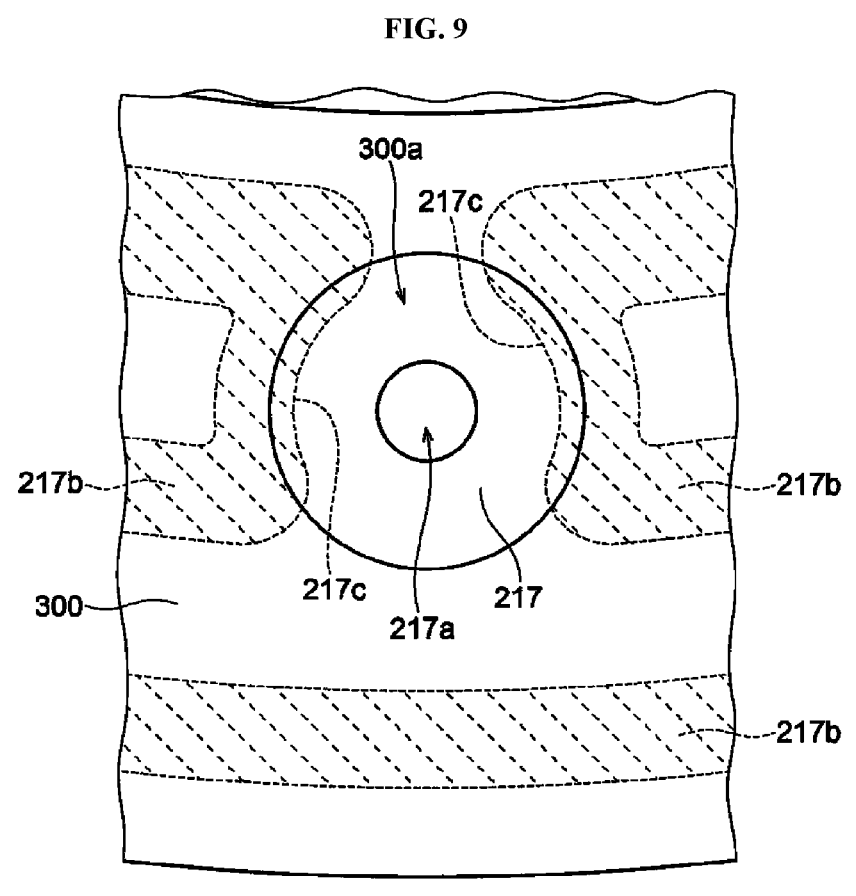

That is, as shown in FIGS. 8 and 9, in a case where the diameter of the second through-hole 300*a* is greater than the diameter of the first through-hole 217*a* and the susceptor heater 217*b* is provided immediately below the second through-hole 300*a*, the direct radiation from the susceptor heater 217*b* (indicated by a solid line arrow in FIG. 8) reaches the portion A of the substrate 200 immediately above the second through-hole 300*a* in addition to the indirect radiation from the susceptor 217 heated by the susceptor heater 217*b* (indicated by a broken line arrow in FIG. 8). As a result, the portion A is heated more sufficiently.

For example, as shown in FIG. 9, the susceptor heater 217*b* is arranged such that at least a part of the susceptor heater 217*b* overlaps the region vertically below the second through-hole 300*a*. With such a configuration, the substrate 200 is subject to the direct radiation from the susceptor heater 17*b*. Thereby, it is possible to promote a local heating by the electromagnetic radiation. Further, as shown in FIG. 9, the susceptor heater 217*b* may include a concave portion 217*c* arranged so as to surround the first through-hole 217*a* along an outer periphery of a folded-back portion of the susceptor heater 217*b* described above. At least a part of the concave portion 217*c* is arranged so as to overlap the region vertically below the second through-hole 300*a*.

Further, the substrate processing apparatus 100 according to the present embodiments further includes a substrate elevator capable of elevating and lowering the substrate 200 above the substrate support 400, and the first through-holes 217*a* and the second through-holes 300*a* are provided such that the substrate lift pins 266 constituting the substrate elevator can be inserted into the first through-holes 217*a* and the second through-holes 300*a* and can be elevated or lowered in the vertical direction.

That is, the substrate elevator is constituted by the susceptor elevator 268 and the substrate lift pins 266. When the susceptor 217 is elevated or lowered by the susceptor elevator 268 in the vertical direction, the substrate 200 is elevated or lowered in the vertical direction relative to the susceptor 217 by the substrate lift pins 266 penetrating the first through-holes 217*a* and the second through-holes 300*a*. When such a substrate elevator is used, the susceptor 217 and the susceptor cover 300 are provided with holes (through-holes) through which the substrate lift pins 266 penetrate. By providing the first through-holes 217*a* and the second through-holes 300*a* as in the present embodiments, it is possible to alleviate the local temperature drop on the surface of the substrate 200 caused by the through-holes, and it is also possible to obtain a desired temperature distribution on the surface of the substrate 200. Further, according to the present embodiments, the first through-hole 217*a* and the second through-hole 300*a* are aligned along the same axis. That is, a first through-hole among the first through-holes 217*a* is aligned along the same axis with a second through-hole among the second through-holes 300*a* corresponding thereto.

Further, in the substrate processing apparatus 100 according to the present embodiments, as shown in FIGS. 7 and 9, at least a part of the upper surface of the susceptor 217 is exposed through the second through-hole 300*a* when viewed from above. With such a configuration, the indirect radiation from the upper surface of the susceptor 217 exposed through the second through-hole 300*a* can be incident onto the substrate 200 through the second through-hole 300*a*.

According to the present embodiments, as shown in FIGS. 1, 6 and 8, the susceptor heater 217*b* itself is arranged inside the susceptor 217 constituted by two components (that is, the upper surface portion 217*d* and the lower surface portion 217*e*). Therefore, the substrate 200 is heated by the heat conduction and heat radiation via the susceptor 217. However, the present embodiments are not limited thereto. For example, when the susceptor 217 is constituted by one component (for example, the lower surface portion 217*e* alone instead of the both of the upper surface portion 217*d* and the lower surface portion 217*e*), the susceptor heater 217*b* may be provided in contact with the lower surface of that one component of the susceptor 217. Also in such a case, the substrate 200 is heated by the heat conduction and heat radiation via the susceptor 217. In both cases described above, the susceptor heater 217*b* is provided at a location where the direct radiation from the susceptor heater 217*b* can be incident onto at least one among the susceptor cover 300 and the substrate 200 through the susceptor 217.

According to the present embodiments, the material of the susceptor 217 is different from the material of the susceptor cover 300. When the susceptor 217 is constituted by the two components (that is, the upper surface portion 217*d* and the lower surface portion 217*e*), the material of at least the upper surface portion 217*d* is different from the material of the susceptor cover 300. Further, it is preferable that the material of the susceptor cover 300 can provide a shield against both of the indirect radiation (which is the electromagnetic radiation from the heated susceptor 217 rather than the heated susceptor heater 217*b*) and the direct radiation (which is the electromagnetic radiation from the heated susceptor heater 217*b*). In the present specification, "shield against both of the indirect radiation and the direct radiation" means that the substrate 200 is protected from being heated by the direct radiation from the susceptor heater 217*b* and also from being heated by the indirect radiation from the heated susceptor 217. Therefore, the heating of the substrate 200 by the direct radiation from the susceptor heater 217*b* and the indirect radiation from the susceptor 217 can be performed only by the electromagnetic radiation through the second through-holes 300*a*. Herein, the term "substantially" means that a tiny amount of the indirect radiation and the direct radiation, which does not cause the heating of the substrate 200 to form the film, may be transmitted through the susceptor cover 300.

Specifically, a transmittance of the material of the susceptor cover 300 is lower than that of the material of the susceptor 217 with respect to a wavelength at which the material of the susceptor 217 is transmitted through within a wavelength range of the electromagnetic radiation from the susceptor heater 217*b*. Further, it is preferable that a thermal conductivity of the material of the susceptor cover 300 is higher than that of the material of the susceptor 217. According to the present embodiments, for example, the material of the susceptor 217 is transparent quartz, and the material of the susceptor cover 300 is SiC.

The diameter of the second through-hole 300*a* is set to a size which enables the temperature distribution on the surface of the substrate 200 to be adjusted to a desired distribution. Alternatively, the diameter of the second through-hole 300*a* is set to a size which enables the temperature distribution on the surface of the substrate 200 to be most uniformized. Alternatively, the diameter of the second through-hole 300*a* is set according to an amount of the direct radiation from the susceptor heater 217*b*. Alternatively, since the amount and spectrum of the direct radiation change depending on the temperature of the susceptor heater 217*b*, the diameter of the second through-hole 300*a* is set according to the temperature of the susceptor heater 217*b* when processing the substrate 200. Alternatively, the diameter of the second through-hole 300*a* is set according to the characteristics (spectrum) of the wavelength of the light (that is, the electromagnetic radiation) absorbed by the substrate 200.

Other Embodiments

While the technique of the present disclosure is described in detail by way of the above-described embodiments, the technique of the present disclosure is not limited thereto. The technique of the present disclosure may be modified in various ways without departing from the scope thereof. For example, the above-described embodiments are described by way of an example in which the oxidation process or a nitriding process by using the plasma is performed on the surface of the substrate. However, the technique of the present disclosure is not limited thereto. For example, the technique of the present disclosure may also be applied to perform a heat treatment process on the substrate placed on the substrate support provided with the susceptor and the susceptor cover. For example, the technique of the present disclosure may also be applied to other processes such as a film-forming process of forming a film on the substrate, a modification process or a doping process on the film formed on the surface of the substrate, a reduction process of an oxide film, an etching process of the film and an ashing process of a photoresist.

Example of Embodiments

In the examples of the embodiments, the susceptor cover 300 of a circular shape (with a diameter of 316 mm) when viewed from above and made of SiC is used. Three second through-holes 300*a* are evenly arranged in the vicinity of an edge of the susceptor cover 300. Further, in the susceptor cover 300 of the examples of the embodiments, diameters of the three second through-holes 300*a* are set to 12 mm, 15 mm and 20 mm, respectively.

In the process chamber 201 described in the embodiments, the susceptor cover 300 is provided on the upper surface of the susceptor 217 in which the first through-holes 217*a* whose diameters are 6.5 mm are evenly arranged at three locations corresponding to the three second through-holes 300*a* such that axes of the second through-holes 300*a* and the first through-holes 217*a* are aligned with each other. According to the examples of the embodiments, the susceptor 217 is constituted by the two components (that is, the upper surface portion 217*d* and the lower surface portion 217*e*) made of transparent quartz and the susceptor heater 217*b* made of SiC interposed therebetween. A wafer (which serves as the substrate 200) made of single crystal silicon whose diameter is 300 mm and whose thickness is 1 mm is placed on the susceptor cover 300. In such a state, a silicon oxide film (also referred to as an "$SiO_2$ film") is formed on the wafer under the following oxidation conditions.

A temperature of the wafer: 700° C.;

A flow rate of the process gas: $O_2/H_2$=1,900 sccm/100 sccm;

The inner pressure of the process chamber: 150 Pa; and

The process time: 600 seconds

After the wafer is processed under the oxidation conditions described above, a thickness of the $SiO_2$ film formed on the wafer is measured for each portion on the surface of the wafer. According to the examples of the embodiments, the thickness of the $SiO_2$ film formed on each portion of the wafer increases as a temperature of each portion of the wafer is elevated. Therefore, the thicker the $SiO_2$ film, the higher the temperature of each portion.

Figure 10:
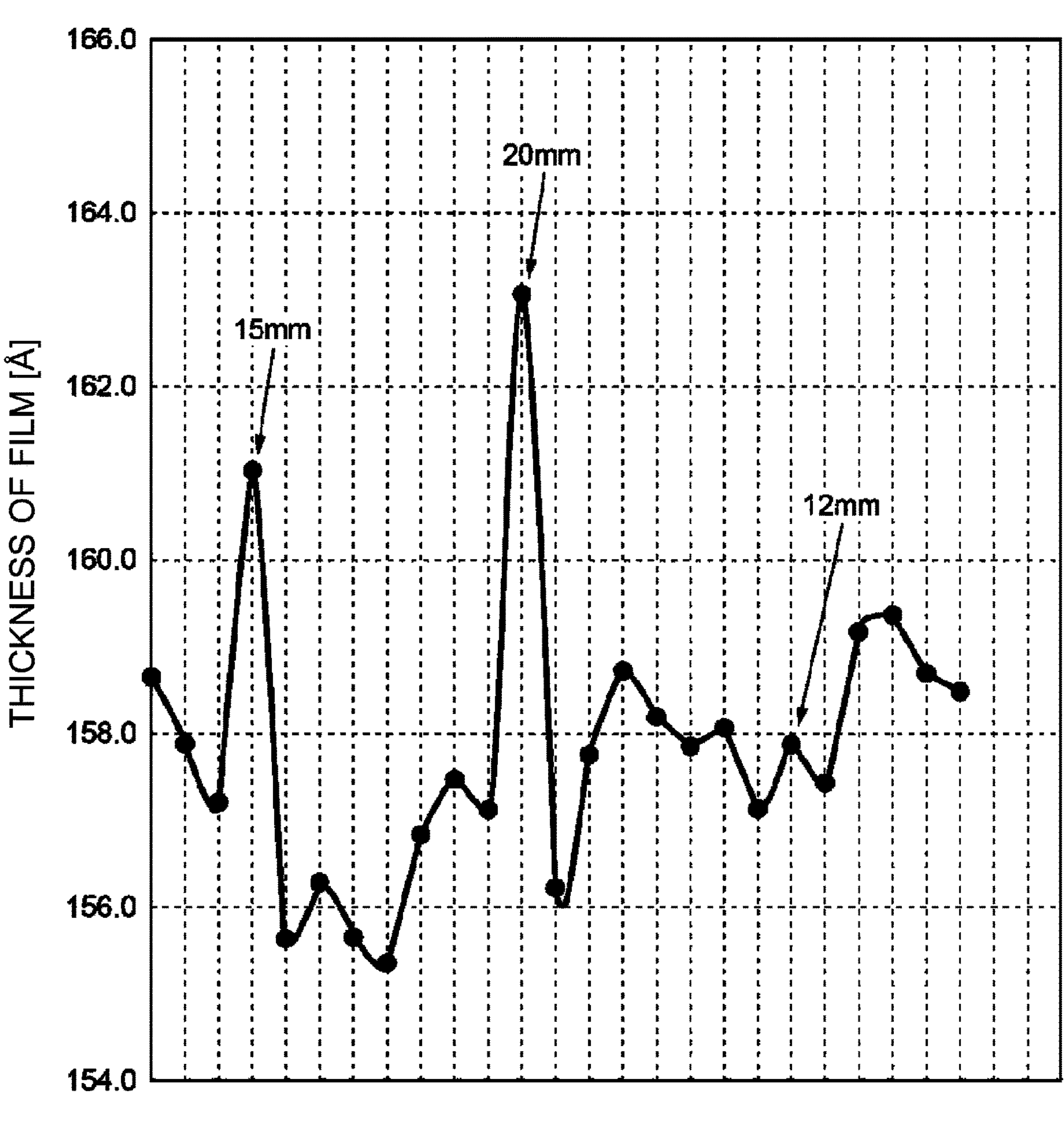
FIG. 10 is a graph schematically illustrating a thickness of a silicon oxide film formed on a substrate according to examples of the embodiments of the present disclosure.

FIG. 10 is a graph schematically illustrating the thickness of the $SiO_2$ film formed on each portion of the wafer according to the examples of the embodiments. In FIG. 10, a vertical axis of the graph represents the thickness of the $SiO_2$ film (unit: Å). Further, a horizontal axis of the graph represents measurement points located along a circumferential direction of the susceptor cover 300, wherein the measurement starts from a measurement point in the vicinity of a certain second through-hole among the second through-holes 300*a* and continues through the other measurement points in the respective vicinities of the two second through-holes among the second through-holes 300*a* until the measurement point of the vicinity of the certain second through-hole is reached again. In the graph, three points indicated by arrows are points corresponding to centers of the second through-holes 300*a*, respectively. Specifically, the point indicated by the arrow on a left portion of the graph corresponds to the center of the second through-hole 300*a* whose diameter is 15 mm, the point indicated by the arrow in a middle portion of the graph corresponds to the center of the second through-hole 300*a* whose diameter is 20 mm, and the point indicated by the arrow in a right portion of the graph corresponds to the center of the second through-hole 300*a* whose diameter is 12 mm.

In the graph of FIG. 10, if the temperature of each of the portions corresponding to the second through-holes 300*a* in the wafer serving as the substrate 200 is lower than that of a peripheral portion thereof, a local minimum value will occur at each measurement point corresponding to each of the portions (that is, the measurement points corresponding to the second through-holes 300*a*). However, from the graph of FIG. 10 of the examples, it can be seen that the local minimum value of the thickness of the $SiO_2$ film does not occur at the measurement points corresponding to the second through-holes 300*a*. That is, it shows that no local temperature drop has occurred in any of the portions corresponding to the second through-holes 300*a* in the examples. Specifically, it can be seen that the thickness of the $SiO_2$ film corresponding to a position of the second through-hole 300*a* whose diameter is 12 mm is as large as the thickness of the $SiO_2$ film at peripheral positions thereof. Further, it shows that the thickness of the $SiO_2$ film corresponding to a position of the second through-hole 300*a* whose diameter is 15 mm (and the thickness of the $SiO_2$ film corresponding to a position of the second through-hole 300*a* whose diameter is 20 mm) is a local maximum value with respect to the thickness of the $SiO_2$ film at peripheral positions thereof. That is, it is confirmed that, in the wafer serving as the substrate 200, the $SiO_2$ film is formed at portions corresponding to the second through-holes 300*a* with the same thickness or a larger thickness than its adjacent region. As described above, it is confirmed that, by setting the diameter of the second through-hole 300*a* greater than the diameter of the first through-hole 217*a* so as to elevate the temperature of the portion corresponding to second through-hole 300*a*, it is possible to obtain the effect of alleviating the local temperature drop.

In addition, from the graph of FIG. 10, it is also confirmed that, in particular, the larger the diameter of the second through-hole 300*a*, the higher the temperature of the portion corresponding to the second through-hole 300*a* in the wafer serving as the substrate 200. That is, it is confirmed that, by increasing the diameter of the second through-hole 300*a*, it is possible to adjust the temperature of the portion corresponding to second through-hole 300*a* to increase.

According to the examples of the present embodiments, when the diameter of the second through-holes 300*a* is 15 mm or 20 mm, the result that the temperature of the portion corresponding to the second through-hole 300*a* is locally higher than the temperature of its adjacent region is remarkable. Therefore, from the viewpoint of improving the temperature uniformity on the surface of the substrate 200, it is preferable that the diameter of the second through-hole 300*a* is greater than or equal to about 1.5 times the diameter of the first through-hole 217*a* (that is, when the diameter of the second through-hole 300*a* is 12 mm) and less than about twice the diameter of the first through-hole 217*a* (that is, when the diameter of the second through-hole 300*a* is 15 mm).

According to some embodiments of the present disclosure, it is possible to provide the technique capable of obtaining the desired temperature distribution on the surface of the substrate placed on the susceptor cover by suppressing the local temperature drop at the portion of the substrate located above the hole of the susceptor cover communicating with the through-hole of the susceptor.

What is claimed is:

1. A substrate processing apparatus comprising:

a process chamber in which a substrate is accommodated;

a substrate support comprising:

a susceptor at least comprising an upper surface portion and a lower surface portion, and configured to support the substrate in the process chamber, and a susceptor cover provided on an upper surface of the upper surface portion, made of material different from at least that of the upper surface portion and formed smaller than the susceptor; and a substrate lift pin, wherein the susceptor further comprises:

a first through-hole penetrating the upper surface portion and the lower surface portion, and a heating element provided between the upper surface portion and the lower surface portion, and configured to heat the substrate, wherein the susceptor cover comprises a second through-hole communicating with the first through-hole and having a diameter greater than a diameter of the first through-hole, and the upper surface portion is partially exposed through the second through-hole, wherein the heating element is located so as to avoid but be directed toward the first through-hole, is folded back immediately before the first through-hole, and surrounds the first through-hole along an outer periphery of each folded-back portion of the heating element, and overlaps with a region vertically below the second through-hole, wherein the substrate lift pin is located so as to avoid an overlap with the heating element when viewed from vertically above the heating element, and is configured to be capable of supporting the substrate in a state where both of the first through-hole and the second through-hole are penetrated by an upper end of the substrate lift pin, wherein a diameter of the upper end of the substrate lift pin is smaller than that of the first through-hole, and wherein the substrate is placed on the susceptor cover to be heated by the heating element via the susceptor cover.

2. The substrate processing apparatus of claim 1, wherein the first through-hole and the second through-hole are arranged such that indirect radiation which is electromagnetic radiation from the susceptor heated by the heating element is incident onto the substrate through the second through-hole.

3. The substrate processing apparatus of claim 1, wherein the heating element and the second through-hole are arranged such that direct radiation which is electromagnetic radiation from the heating element is incident onto the substrate through the second through-hole.

4. The substrate processing apparatus of claim 1, further comprising a substrate elevator configured to elevate or lower the substrate above the susceptor, wherein the substrate elevator is configured to be capable of locating the upper end of the substrate lift pin below the upper surface of the susceptor.

5. The substrate processing apparatus of claim 4, wherein the substrate elevator is configured to be capable of locating the upper end of the substrate lift pin below a lower surface of the susceptor.

6. The substrate processing apparatus of claim 5, wherein the heating element and the second through-hole are arranged such that direct radiation which is electromagnetic radiation from the heating element is incident onto the substrate through the second through-hole while the upper end of the substrate lift pin is located below the lower surface of the susceptor.

7. The substrate processing apparatus of claim 4, wherein the first through-hole and the second through-hole are arranged such that indirect radiation which is electromagnetic radiation from the susceptor heated by the heating element is incident onto the substrate through the second through-hole while the upper end of the substrate lift pin is located below the upper surface of the susceptor.

8. The substrate processing apparatus of claim 1, wherein the susceptor is made of a material capable of being transmitted through by direct radiation which is electromagnetic radiation from the heating element.

9. The substrate processing apparatus of claim 1, wherein the susceptor cover is made of a material capable of shielding both of indirect radiation which is electromagnetic radiation from the susceptor heated by the heating element and direct radiation which is electromagnetic radiation from the heating element.

10. The substrate processing apparatus of claim 1, wherein an opening diameter of the second through-hole on an upper surface of the susceptor cover and an opening diameter of the second through-hole on a lower surface of the susceptor cover facing the susceptor are greater than the diameter of the first through-hole on the upper surface of the susceptor.

11. The substrate processing apparatus of claim 1, wherein an opening diameter of the second through-hole on a lower surface of the susceptor cover facing the susceptor is equal to an opening diameter of the second through-hole on an upper surface of the susceptor cover.

12. The substrate processing apparatus of claim 1, wherein the diameter of the second through-hole is equal to or greater than 1.5 times the diameter of the first through-hole and less than 2 times the diameter of the first through-hole.

13. The substrate processing apparatus of claim 1, wherein the diameter of the second through-hole is equal to or greater than 12 mm and less than 15 mm.

14. The substrate processing apparatus of claim 1, wherein the susceptor cover is arranged such that the first through-hole and the second through-hole are aligned along a same axis.

15. The substrate processing apparatus of claim 1, wherein the heating element comprises a concave portion comprising a protrusion protruding toward a center of the first through-hole, and configured to surround the first through-hole along the outer periphery of each folded-back portion of the heating element, and wherein a part of the concave portion overlaps with the region vertically below the second through-hole.

16. The substrate processing apparatus of claim 15, wherein the second through-hole is configured such that the direct electromagnetic radiation from the part of the concave portion of heating element is transmitted therethrough.

17. The substrate processing apparatus of claim 1, wherein the heating element and the second through-hole are arranged such that, in a state where the upper end of the substrate lift pin is located above the upper surface of the susceptor, direct electromagnetic radiation from the heating element is incident onto the substrate via the second through-hole.

18. The substrate processing apparatus of claim 1, wherein the substrate lift pin is located below the second through-hole while the substrate is being processed.

19. The substrate processing apparatus of claim 1, further comprising:

a process vessel constituting the process chamber, wherein the process vessel comprises an upper vessel and a lower vessel, and a lower end of the substrate lift pin is installed at a bottom of the lower vessel.

20. A susceptor assembly comprising:

a susceptor configured to support a substrate and comprising an upper surface portion, a lower surface portion, a first through-hole penetrating the upper surface portion and the lower surface portion, and a heating element provided between the upper surface portion and the lower surface portion and configured to heat the substrate; and a susceptor cover made of material different from at least that of the upper surface portion, formed smaller than the susceptor, installed on an upper surface of the upper surface portion, and comprising:

a second through-hole communicating with the first through-hole and having a diameter greater than a diameter of the first through-hole, wherein a surface of the upper surface portion is partially exposed through the second through-hole, wherein the heating element is located so as to avoid but be directed toward the first through-hole, is folded back immediately before the first through-hole, and surrounds the first through-hole along an outer periphery of each folded-back portion of the heating element, and overlaps with a region vertically below the second through-hole, wherein the substrate is placed on the susceptor cover to be heated by the heating element via the susceptor cover, and wherein the diameter of the second through-hole is equal to or greater than 1.5 times the diameter of the first through-hole and less than 2 times the diameter of the first through-hole.

* * * * *